US011906595B2

(12) United States Patent
Matsuda

(10) Patent No.: US 11,906,595 B2
(45) Date of Patent: Feb. 20, 2024

(54) BATTERY PACK AND MOVABLE MACHINE INCLUDING THE SAME

(71) Applicant: KAWASAKI MOTORS, LTD., Akashi (JP)

(72) Inventor: Yoshimoto Matsuda, Kobe (JP)

(73) Assignee: KAWASAKI MOTORS, LTD., Akashi (JP)

( * ) Notice: Subject to any disclaimer, the term of this patent is extended or adjusted under 35 U.S.C. 154(b) by 723 days.

(21) Appl. No.: 16/718,461

(22) Filed: Dec. 18, 2019

(65) Prior Publication Data
US 2020/0212513 A1 Jul. 2, 2020

(30) Foreign Application Priority Data
Dec. 26, 2018 (JP) ................. 2018-243077

(51) Int. Cl.
*G01R 31/392* (2019.01)
*B60L 50/51* (2019.01)
*H01M 10/42* (2006.01)
*H01M 10/48* (2006.01)
*B60L 50/60* (2019.01)

(52) U.S. Cl.
CPC ............ *G01R 31/392* (2019.01); *B60L 50/51* (2019.02); *B60L 50/66* (2019.02); *H01M 10/4285* (2013.01); *H01M 10/48* (2013.01); *B60L 2210/40* (2013.01); *H01M 2220/20* (2013.01)

(58) Field of Classification Search
None
See application file for complete search history.

(56) References Cited

U.S. PATENT DOCUMENTS

| | | | |
|---|---|---|---|
| 2004/0050609 A1 | 3/2004 | Machida et al. | |
| 2008/0084180 A1* | 4/2008 | Hasegawa | H01M 10/42 320/112 |
| 2008/0297116 A1* | 12/2008 | Odaohhara | H01M 10/48 340/815.4 |
| 2012/0259567 A1* | 10/2012 | Lapierre | H01M 10/441 320/128 |
| 2012/0274280 A1* | 11/2012 | Yip | H02J 7/00302 320/112 |
| 2014/0143940 A1* | 5/2014 | Iuliano | A42B 3/046 2/422 |
| 2014/0342193 A1* | 11/2014 | Mull | H01M 10/4257 429/61 |
| 2014/0379209 A1 | 12/2014 | Matsuda | |

(Continued)

FOREIGN PATENT DOCUMENTS

DE 10334095 A1 2/2004
EP 2799274 A1 11/2014
(Continued)

*Primary Examiner* — Brent A. Fairbanks
(74) *Attorney, Agent, or Firm* — Alleman Hall & Tuttle LLP

(57) ABSTRACT

Provided is a battery pack adapted to be removably mounted on a movable machine, the battery pack including: a rechargeable battery unit; a detector secured to the battery unit to detect the motion of the battery unit; a memory device; a processing device configured to record a history of motion information detected by the detector in the memory device; and an interface configured to output the motion information recorded in the memory device to the outside of the battery pack.

13 Claims, 6 Drawing Sheets

(56) References Cited

U.S. PATENT DOCUMENTS

| | | | |
|---|---|---|---|
| 2015/0251716 A1* | 9/2015 | Matsuda | B60L 58/14 |
| | | | 29/593 |
| 2015/0274019 A1* | 10/2015 | Matsuda | B60T 8/246 |
| | | | 701/22 |
| 2016/0321845 A1 | 11/2016 | Maeda et al. | |
| 2017/0259872 A1 | 9/2017 | Iwamoto | |
| 2018/0040920 A1* | 2/2018 | Takatsuka | H01M 10/486 |
| 2022/0077515 A1* | 3/2022 | Leyvi | H01M 10/482 |

FOREIGN PATENT DOCUMENTS

| | | |
|---|---|---|
| EP | 3557716 A1 | 10/2019 |
| JP | 5681817 B2 | 3/2015 |
| JP | 2015047917 A | 3/2015 |
| JP | 2017159806 A | 9/2017 |
| WO | 2018135663 A1 | 7/2018 |

* cited by examiner

BATTERY PACK AND MOVABLE MACHINE INCLUDING THE SAME

CROSS-REFERENCE TO RELATED APPLICATION

This application claims priority to and the benefit of Japanese Patent Application No. 2018-243077, filed on Dec. 26, 2018, the entire disclosure of which is incorporated herein by reference.

BACKGROUND OF THE INVENTION

Field of the Invention

The present disclosure relates to a battery pack adapted to be removably mounted on a movable machine such as an electric motorcycle and also relates to a movable machine including the battery pack.

Description of the Related Art

A movable machine such as an electric motorcycle is equipped with an electric component such as a battery unit. The electric component may be affected by a physical load imposed on the body of the movable machine. When the movable machine is a motorcycle, examples of the physical load include vertical shake and impact accompanying a minor fall accident such as standing fall. The electric component may not become disabled but can suffer some damage due to such a physical load. Japanese Patent No. 5681817 discloses a diagnosis system that enables prevention or early identification of abnormality of an electric component such as a battery unit, the system including a vehicle body state sensor that detects a physical load imposed on a vehicle body of an electric vehicle and being configured to diagnose an electric component of the vehicle based on the detected physical load.

When a battery unit is designed to be removably mounted on a movable machine such as an electric motorcycle, the battery unit is stored and transferred separately from the movable machine before being mounted on the movable machine. Thus, at the storage site or during transfer, the battery unit may be damaged by falling over or by dropping from a person's hands. The above-mentioned diagnosis system is configured to detect a physical load imposed on a vehicle body and diagnose an electric component such as a battery unit mounted on the vehicle body, and has the disadvantage of being unable to diagnose whether the battery unit has been damaged before mounting on the vehicle.

SUMMARY OF THE INVENTION

It is therefore an object of the present invention to provide a battery pack adapted to be removably mounted on a movable machine such as an electric motorcycle, the battery pack being configured to enable diagnosis of what state a battery unit of the battery pack has been in before mounting of the battery pack on the movable machine. The present invention further provides a movable machine including the battery pack.

In order to achieve the above object, a battery pack according to an aspect of the present invention is adapted to be removably mounted on a movable machine and includes: a rechargeable battery unit; a detector secured to the battery unit to detect the motion of the battery unit; a memory device; a processing device configured to record a history of motion information detected by the detector in the memory device; and an interface configured to output the motion information recorded in the memory device to the outside of the battery pack.

With the above configuration, the inclusion of the detector in the battery pack enables detection of the motion of the battery pack before mounting of the battery pack on a movable machine such as an electric motorcycle (e.g., during storage of the battery pack, during transfer of the battery pack, and during a period in which the battery pack is detached from the movable machine). Thus, the motion information history recorded in the memory device can be used to diagnose what state the battery unit has been in before mounting on the movable machine. For example, it is possible to diagnose whether the battery unit may have been damaged by an external physical load before mounting on the movable machine.

The battery pack may further include a temperature sensor configured to detect the temperature of the battery unit, and the processing device may diagnose the state of the battery unit based on a history of temperature information detected by the temperature sensor. With this configuration, the accuracy of the diagnosis of the state of the battery unit is improved.

A movable machine according to an aspect of the present invention includes the above-defined battery pack and an electric motor for propulsion of the movable machine, the electric motor being configured to use the battery unit of the battery pack as a power source or an auxiliary power source. With this configuration, the state of the battery unit can be diagnosed before the movable machine with the battery pack mounted thereon is driven.

The movable machine may be a vehicle capable of traveling in an inclined state and may further include a computing device configured to estimate the posture of the movable machine during travel based on motion information detected by the detector after mounting of the battery pack on the movable machine. With this configuration, motion information detected by the detector is used for estimation of the posture of the movable machine after mounting of the battery pack on the movable machine. This eliminates the need for disposing a detector on the movable machine in order to estimate the posture of the movable machine during travel. Thus, the flexibility in space layout of the movable machine can be increased, and at the same time cost reduction of the movable machine can be achieved.

In the movable machine, the computing device or the processing device may diagnose the state of the battery unit based on a history of motion information detected by the detector before mounting of the battery pack on the movable machine. With this configuration, the computing device or the processing device diagnoses what state the battery unit of the battery pack has been in before mounting of the battery pack on the movable machine. This eliminates the need for providing an additional device for analysis of the history of the motion information.

The movable machine may further include a display device configured to display a result of diagnosis made by the computing device or the processing device for the state of the battery unit. With this configuration, the diagnosis result of the battery unit can easily be checked.

The movable machine may further include a battery placement portion in which the battery pack is placed with the memory device electrically connected to the computing device via the interface, and the battery placement portion may be configured so that the detector of the battery pack placed in the battery placement portion is located in a central region of the movable machine in a leftward/rightward direction. This configuration allows the computing device to estimate the posture of the movable machine with improved accuracy.

The movable machine may further include a battery placement portion in which the battery pack is placed with the memory device electrically connected to the computing device via the interface, the detector may have a sensor coordinate system having three axes orthogonal to one another and detect the motion of the battery unit with respect to the sensor coordinate system, and the battery placement portion may be configured so that the three axes of the sensor coordinate system of the detector of the battery pack placed in the battery placement portion are respectively parallel to a forward/rearward direction, a leftward/rightward direction, and an upward/downward direction of the movable machine. With this configuration, the detection values obtained by the detector with respect to the sensor coordinate system can be used as values obtained with respect to the coordinate system of the movable machine. This allows the computing device to easily perform computation in estimating the posture of the movable machine based on the history of the motion information. The computing device can easily use the detection values of the detector for estimation of the posture of the movable machine.

The above and further objects, features and advantages of the present disclosure will be more apparent from the following detailed description of preferred embodiments with reference to the accompanying drawings.

DETAILED DESCRIPTION OF THE EMBODIMENTS

Hereinafter, embodiments will be described with reference to the drawings. The same or equivalent elements are denoted by the same reference signs throughout all the drawings and will not be described repeatedly. In the following description, the directions are defined with respect to a direction in which a driver operating an electric motorcycle described as an exemplary movable machine faces. The vehicle lengthwise direction corresponds to the forward/rearward direction, and the vehicle width direction corresponds to the leftward/rightward direction.

Figure 1:
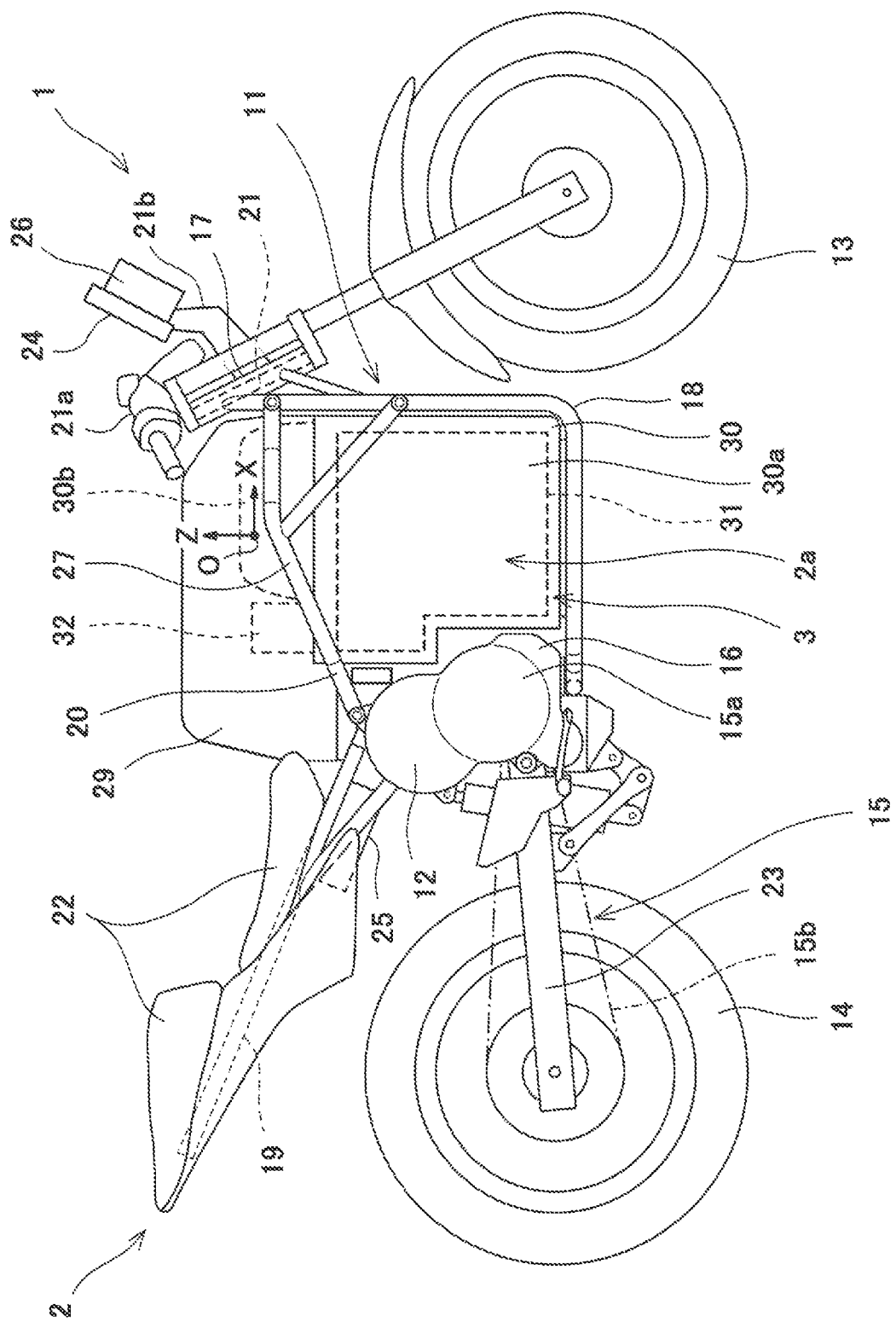
FIG. 1 is a right side view of an electric motorcycle including a battery pack according to an embodiment.
Figure 2:
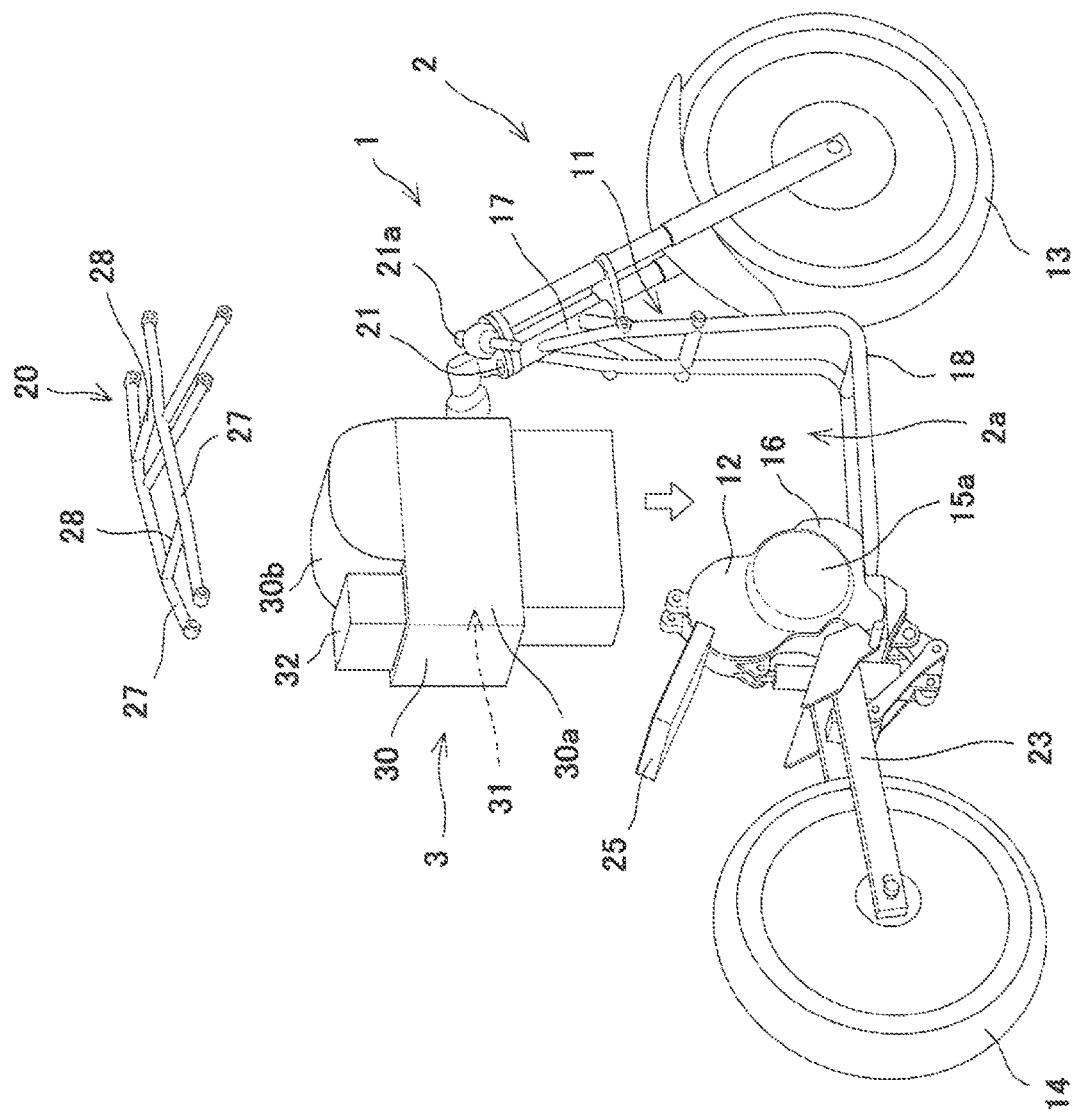
FIG. 2 is an exploded perspective view of the electric motorcycle shown in FIG. 1.

FIG. 1 is a right side view of an electric motorcycle 1 according to an embodiment. FIG. 2 is an exploded perspective view of the electric motorcycle 1 shown in FIG. 1. As shown in FIGS. 1 and 2, the electric motorcycle 1 includes a vehicle body 2 and a battery pack 3. The battery pack 3 is removably mounted on the vehicle body 2. The battery pack 3 is smaller in size than the vehicle body 2. Specifically, the dimensions of the battery pack 3 in the forward/rearward, upward/downward, and leftward/rightward directions are smaller than the dimensions of the vehicle body 2 in the forward/rearward, upward/downward, and leftward/rightward directions, respectively.

As shown in FIG. 1, the vehicle body 2 includes a vehicle body frame 11, wheels, and an electric motor 12 that generates drive power transmitted to at least one of the wheels. In the present embodiment, the wheels include one front wheel 13 serving as a driven wheel and as a steerable wheel and one rear wheel 14 serving as a drive wheel. The drive power generated by the electric motor 12 is transmitted to the rear wheel 14 via a power transmission mechanism 15. The power transmission mechanism 15 includes: a transmission 15a that changes the speed of rotation transmitted from the electric motor 12; and a mechanism 15b (such as a chain transmission mechanism or a belt transmission mechanism) that transmits to the axle of the rear wheel 14 the rotational power output from the transmission 15a. The electric motor 12, together with the transmission 15a, is housed in a motor unit case 16.

The vehicle body frame 11 includes a head pipe 17, a main frame 18, a seat frame 19, and a subframe 20. The head pipe 17 rotatably supports a steering shaft 21. To the steering shaft 21 is attached a bar-shaped handle 21a extending in the leftward/rightward direction. In the present embodiment, the main frame 18 extends downward from the head pipe 17 and is bent to extend rearward. The seat frame 19 supports a seat 22 on which the driver and a passenger sit. In the present embodiment, for example, the motor unit case 16 constitutes a part of the vehicle body frame 11, a rear end of the main frame 18 is coupled to a lower front portion of the motor unit case 16, a swing arm 23 is pivotally supported by the motor unit case 16, and the seat frame 19 extends rearward from an upper portion of the motor unit case 16.

The vehicle body 2 includes a display device 24, an inverter 25, and a vehicle controller (electronic control unit, abbreviated as ECU) 26. The display device 24 and the vehicle controller 26 are integrally constructed as a control unit, and the control unit is disposed forward of the handle 21a and supported by the head pipe 17 via a bracket 21b.

The display device 24 displays, for example, the travel speed, the motor rotational speed, and the remaining battery capacity. The inverter 25 converts DC power discharged from the battery pack 3 to AC power. The vehicle controller 26 (corresponding to the "computing device" in the present invention) controls the switching operation of the inverter 25. The inverter 25 and the vehicle controller 26 are communicatively connected by communication means such as controller area network (CAN). The electric motor 12 is operated with AC power supplied from the inverter 25 and generates drive power. The vehicle controller 26 controls the inverter 25 in accordance with the driver's request and the vehicle state, such as in accordance with the amount of operation of an accelerator member operated by the driver, the rotational speed of the electric motor 12, and the state of a battery unit 31. Through this control, the vehicle controller 26 controls the operation of the electric motor 12 to execute travel control matching the driver's request and the vehicle state. In order to achieve such travel control, the vehicle body 2 includes a plurality of sensors that detect the driver's request and the vehicle state. The vehicle body 2 is not equipped with an acceleration sensor or an angular velocity sensor. As described later, an acceleration sensor 33 and an angular velocity sensor 34 of the battery pack 3 are used for detection of the acceleration and angular velocity of the electric motorcycle 1.

In the present embodiment, the motor unit case 16 constitutes a part of the vehicle body frame 11. However, the motor unit case 16 may be separately provided from the vehicle body frame 11. For example, the main frame 18, the seat frame 19, and the swing arm 23 may be coupled to a pivot bracket, and the motor unit case 16 may be supported by the pivot bracket. In the present embodiment, the inverter 25 is supported by the seat frame 19, and the vehicle controller 26 is supported by the head pipe 17. However, the supporting structure and arrangement may be modified. The display device 24 and vehicle controller 26 need not be integrally constructed and may be provided separately from each other. The devices 24 to 26 may be supported and arranged in any manner that allows the vehicle body 2 to be constructed separately from the battery pack 3.

The vehicle body 2 has a housing space 2*a* (corresponding to the "battery placement portion" of the present invention) for housing the battery pack 3 disposed between the front and rear wheels 13 and 14. In the housing space 2*a*, the battery pack 3 is housed in such a manner that a battery monitoring unit 36 described later is electrically connected to the vehicle controller 26. The housing space 2*a* is configured so that the acceleration sensor 33 and angular velocity sensor 34 (described later) of the battery pack 3 housed in the housing space 2*a* are located in a central region of the vehicle body 2 in the leftward/rightward direction. The housing space 2*a* is provided rearward of the head pipe 17 and forward of the motor unit case 16. In the present embodiment, for example, the battery pack 3 is supported by a portion of the main frame 18 that extends in the vehicle lengthwise direction.

The subframe 20 includes left and right upper frames 27 coupled to each other via a cross frame 28 in the vehicle width direction. Each upper frame 27 is located outwardly of the battery pack 3 supported on the main frame 18 in the vehicle width direction, extends in the vehicle lengthwise direction, and defines an outer edge of the housing space 2*a* in the vehicle width direction. Thus, the battery pack 3 can be protected by the subframe 20 in the vehicle width direction. Additionally, a side cowl (not shown) is disposed outwardly of the side surfaces of the battery pack 3 in the vehicle width direction and covers those regions of the side surfaces which are located below the subframe 20, and a top cover 29 (see FIG. 1) covers the battery pack 3 from above. Thus, the battery pack 3 is protected from the outside environment also by the side cowl and the top cover 29. As shown in FIG. 2, the subframe 20 is detachably coupled to a portion of the vehicle body frame 11 by fastening means (not shown) such as bolts, the portion being other than the subframe 20.

The battery pack 3 includes a case 30 and a battery unit 31. The case 30 includes a battery housing portion 30*a* housing the battery unit 31 and an electric component housing portion 30*b* housing an electric component other than the battery unit 31. The electric component housing portion 30*b* is disposed on top of the battery housing portion 30*a*. The battery unit 31 is capable of storing DC power and is used as a power supply for the electric motor 12. The battery pack 3 includes a charging connector 32 used for charging of the battery unit 31. In the present embodiment, for example, the charging connector 32 is disposed on top of the battery housing portion 30*a* and rearwardly of the electric component housing portion 30*b*.

Figure 3:
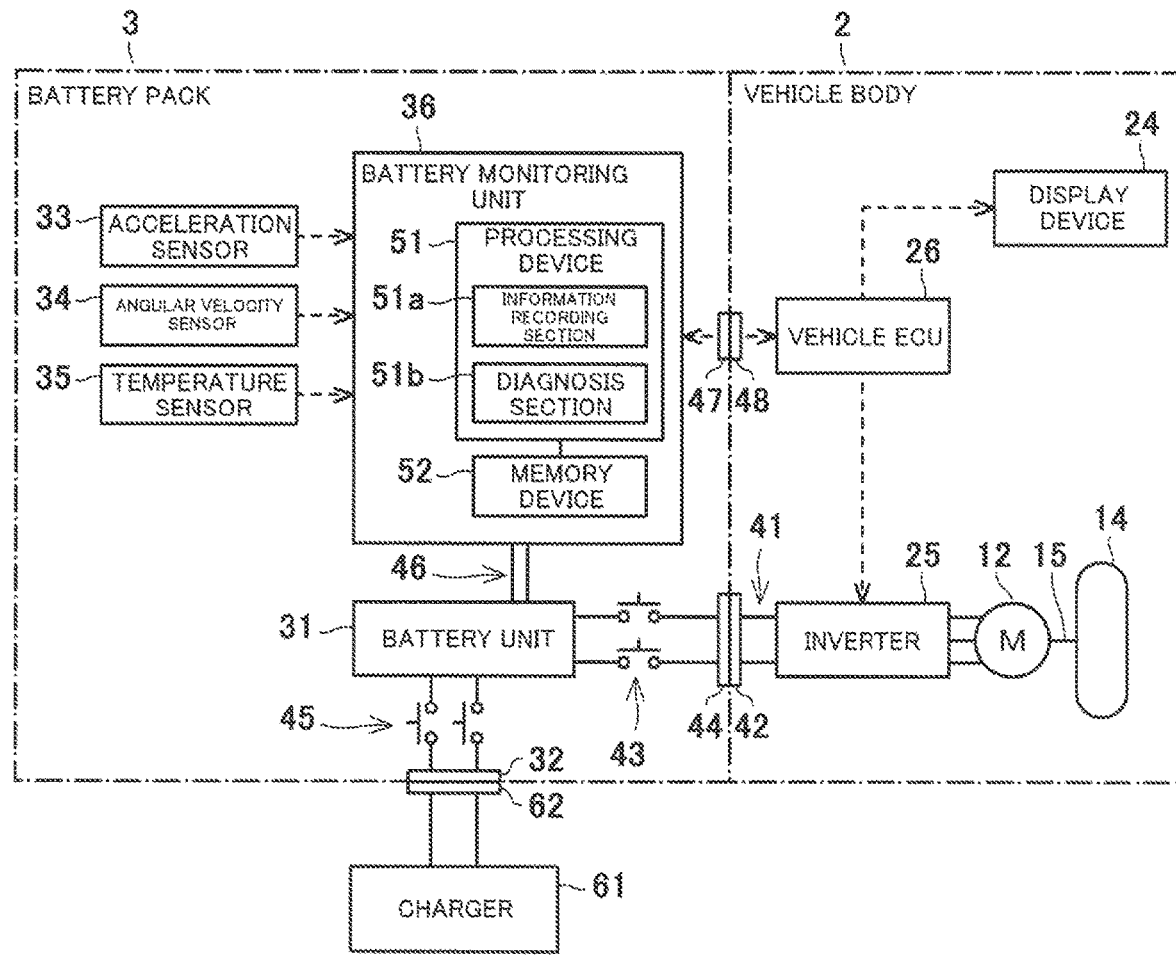
FIG. 3 is a block diagram showing the electrical configuration of the electric motorcycle shown in FIG. 1.

FIG. 3 is a block diagram showing the electrical configuration of the electric motorcycle 1 shown in FIG. 1. As shown in FIG. 3, the vehicle body 2 includes the electric motor 12, the rear wheel 14, the power transmission mechanism 15, the display device 24, the inverter 25, and the vehicle controller 26 which are mentioned above. The display device 24 is communicatively connected to the vehicle controller 26. The inverter 25 is mechanically and electrically connected to a vehicle body-side electricity supply connector 42 via a line 41 through which a DC current flows. The battery unit 31 of the battery pack 3 includes a battery composed of, for example, a plurality of battery cells (not shown) connected in series. Each battery cell is a secondary cell capable of repeated charge and discharge and is, for example, a lithium-ion cell. The battery of the battery unit 31 is connected to a battery-side electricity supply connector 44 via a line 43. The two connectors 42 and 44 are mechanically connected together to establish electrical connection of the battery of the battery unit 31 to the inverter 25.

The battery unit 31 is connected to the charging connector 32 via a line 45. The charging connector 32 is connectable to a connector 62 of a charger 61 serving as an external power supply. The connection of the charging connector 32 to the external charging connector 62 enables the battery unit 31 to be charged with electricity supplied from the charger 61.

The battery pack 3 includes an acceleration sensor 33, an angular velocity sensor 34, a temperature sensor 35, and a battery monitoring unit 36. The acceleration sensor 33 and angular velocity sensor 34 are secured to the battery unit 31 directly or indirectly via the case 30 and detect the motion of the battery unit 31. The acceleration sensor 33 detects motion with respect to a three-axis sensor coordinate system having X, Y, and Z axes orthogonal to one another, and the angular velocity sensor 34 also detects motion with respect to a three-axis sensor coordinate system having X, Y, and Z axes orthogonal to one another. The three axes of the sensor coordinate system of the acceleration sensor 33 are respectively parallel to the three axes of the sensor coordinate system of the angular velocity sensor 34. The acceleration sensor 33 is a triaxial acceleration sensor that detects accelerations in the three axial directions orthogonal to one another. The angular velocity sensor 34 is a triaxial angular velocity sensor that detects angular velocities about the three axes orthogonal to one another. The acceleration sensor 33 and angular velocity sensor 34 may be provided as separate sensors or may be integrally constructed as a so-called six-axis sensor (inertial measurement unit).

Figure 4:
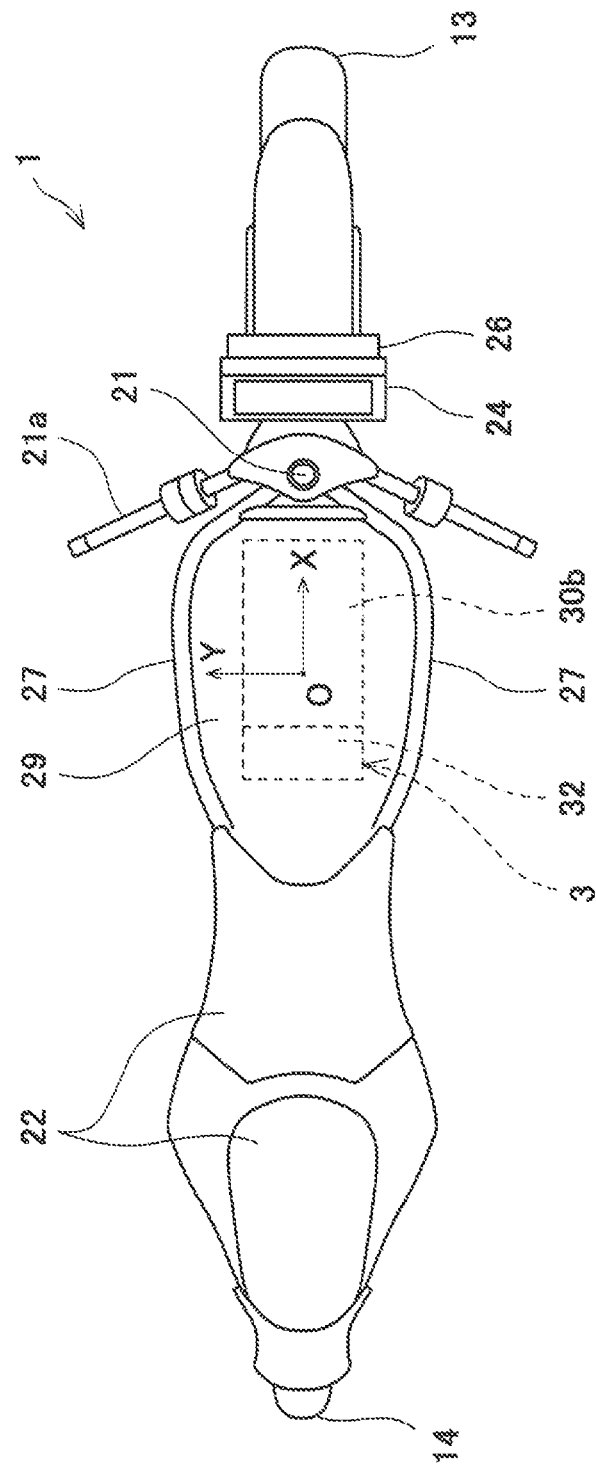
FIG. 4 is a top view of the electric motorcycle shown in FIG. 1.

FIG. 4 is a top view of the electric motorcycle 1. The sensor coordinate systems of the acceleration sensor 33 and angular velocity sensor 34 are shown in FIGS. 1 and 4. With the battery pack 3 mounted on the vehicle body 2, the acceleration sensor 33 and angular velocity sensor 34 are located in a central region of the vehicle body 2 in the leftward/rightward direction. More specifically, with the battery pack 3 mounted on the vehicle body 2, the origins O of the sensor coordinate systems of the acceleration sensor 33 and angular velocity sensor 34 are located in a central region of the vehicle body 2 in the leftward/rightward direction. With the battery pack 3 mounted on the vehicle body 2, the acceleration sensor 33 and angular velocity sensor 34 are located between the handle 21*a* and the seat 22 in the forward/rearward direction of the vehicle body 2.

With the battery pack 3 mounted on the vehicle body 2, the three axes (X, Y, and Z axes) of the sensor coordinate system of the acceleration sensor 33 are respectively parallel to the forward/rearward, leftward/rightward, and upward/downward directions of the electric motorcycle 1, and the three axes (X, Y, and Z axes) of the sensor coordinate system of the angular velocity sensor 34 are respectively parallel to the forward/rearward, leftward/rightward, and upward/downward directions of the electric motorcycle 1. In other words, the housing space 2a is configured to house the battery pack 3 in a position where the three axes of each sensor coordinate system are respectively parallel to the forward/rearward, leftward/rightward, and upward/downward directions of the electric motorcycle 1. Both the acceleration sensor 33 and angular velocity sensor 34 correspond to the "detector" of the present invention. The temperature sensor 35 is secured to the battery unit 31 and detects the temperatures of the battery cells of the battery unit 31.

Referring back to FIG. 3, the battery monitoring unit 36 is electrically connected to the acceleration sensor 33, the angular velocity sensor 34, and the temperature sensor 35. The battery monitoring unit 36 monitors the state of the battery unit 31 based on information detected by the acceleration sensor 33, the angular velocity sensor 34, and the temperature sensor 35.

The battery monitoring unit 36 includes a processing device 51 and a memory device 52. The processing device 51 includes a memory storing various programs and a central processing unit (CPU) that performs processing operations by executing the programs stored in the memory. The processing device 51 functions as an information recording section 51a and a diagnosis section 51b by executing predetermined programs stored in the memory.

The information recording section 51a records in the memory device 52 a history of detection information obtained by the acceleration sensor 33, the angular velocity sensor 34, and the temperature sensor 35. The diagnosis section 51b diagnoses the state of the battery unit 31 in terms of physical load based on motion information detected by the acceleration sensor 33 and angular velocity sensor 34 and recorded in the memory device 52. The diagnosis made by the diagnosis section 51b based on the motion information recorded in the memory device 52 will be described in detail later.

The diagnosis section 51b diagnoses the state of the battery unit 31 also in terms of thermal load based on temperature information detected by the temperature sensor 35 and recorded in the memory device 52. For example, the diagnosis section 51b uses temperature information obtained for each of the battery cells of the battery unit 31 to estimate the state of charge (SOC) of the battery unit 31 or determine whether each of the battery cells has any defect.

The battery monitoring unit 36 is an electric component operated at a lower voltage than the electric motor 12. The battery monitoring unit 36 is operated with electricity supplied from the battery of the battery unit 31. In the present embodiment, the battery monitoring unit 36 is connected to the battery of the battery unit 31 via a line 46 and an unillustrated step-down circuit. The step-down circuit need not be provided between the battery unit 31 and the battery monitoring unit 36 and, for example, the battery unit 31 and the battery monitoring unit 36 may be connected via a line in such a manner as to allow part of the battery cells of the battery unit 31 to supply electricity to the battery monitoring unit 36.

The battery monitoring unit 36 is communicatively connected to the vehicle controller 26. Specifically, the battery monitoring unit 36 is communicatively connected to a battery-side communication connector 47 (corresponding to the "interface" of the present invention), and the vehicle controller 26 is communicatively connected to a vehicle body-side communication connector 48. The two connectors 47 and 48 are mechanically and electrically connected to enable two-way transmission of information between the battery monitoring unit 36 and the vehicle controller 26. The result of diagnosis made by the diagnosis section 51b is sent from the battery monitoring unit 36 to the vehicle controller 26.

The vehicle controller 26 causes the display device 24 to display the received diagnosis result. In the present embodiment, the state of the battery unit 31 before mounting of the battery pack 3 on the vehicle body 2 can be known from the diagnosis result displayed by the display device 24.

Specifically, the diagnosis section 51b of the battery monitoring unit 36 in the present embodiment calculates an impact force applied to the battery unit 31 based on the motion information history recorded in the memory device 52. If the calculated impact force is equal to or larger than a predetermined threshold, the diagnosis section 51b determines that the battery unit 31 may have been damaged. For example, if the calculated impact force is equal to or larger than a predetermined threshold, the diagnosis section 51b infers that the battery pack 3 has been dropped from a height equal to or greater than a certain height. Based on the result of diagnosis made by the diagnosis section 51b, the display device 24 displays, for example, a message which reads "The battery pack has been dropped", "Battery use: NG", or "Battery error".

As described above, the motion information detected by the acceleration sensor 33 and angular velocity sensor 34 is used to diagnose the state of the battery unit 31 in terms of physical load. In the present embodiment, motion information detected by the acceleration sensor 33 and angular velocity sensor 34 after mounting of the battery pack 3 on the vehicle body 2 is used by the vehicle controller 26 as information for estimating the posture of the electric motorcycle 1 during travel. The use of the motion information will be described with reference to FIG. 5.

Figure 5:
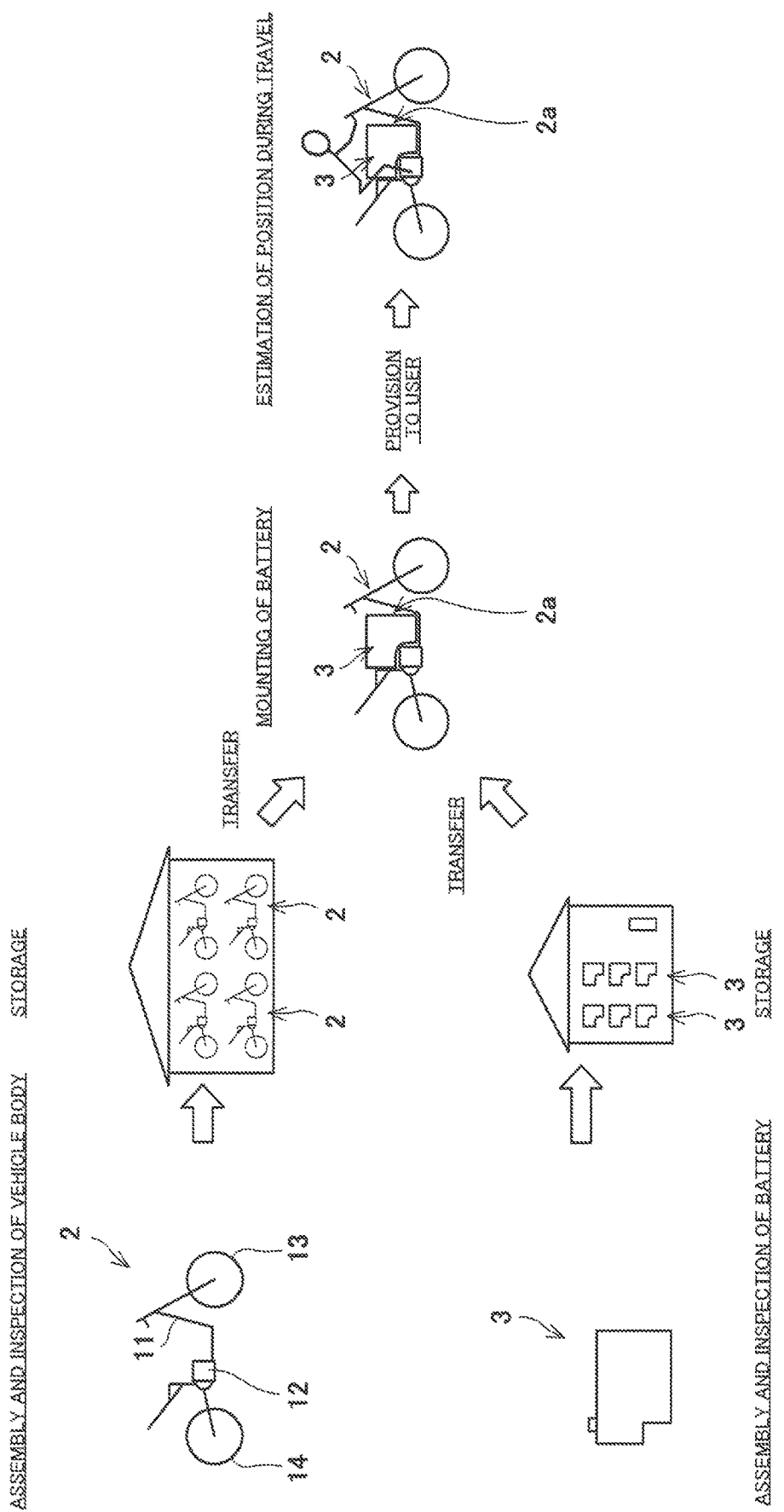
FIG. 5 is a diagram for illustrating how to use information detected by a detector of the battery pack shown in FIG. 1.

FIG. 5 is a diagram for illustrating how to use the information detected by the acceleration sensor 33 and angular velocity sensor 34 of the battery pack 3. Specifically, FIG. 5 shows the process flow from assembly of the electric motorcycle 1 to usage of the electric motorcycle 1 by a user. The battery pack 3 and the vehicle body 2 are assembled and stored independently of each other.

The vehicle body 2 is assembled at a vehicle body assembly site, and the assembled vehicle body 2 is carried to a vehicle body inspection site without mounting of the battery pack 3 on the vehicle body 2. At the vehicle body inspection site, the vehicle body 2 is subjected to a vehicle body inspection. Having passed the vehicle body inspection, the vehicle body 2 is prepared for being shipped and combined with the battery pack 3 and is transferred manually or mechanically from the vehicle body inspection site to a mounting site.

Separately from the production and inspection of the vehicle body 2, assembly of the battery pack 3 is performed at a battery assembly site, and the assembled battery pack 3 is carried to a battery inspection site without being mounted on the vehicle body 2. At the battery inspection site, the battery pack 3 is subjected to a quality inspection. The battery inspection site may be the same as the battery assembly site. In the quality inspection, mainly the electrical configuration of the battery pack 3 is inspected. Having passed the quality inspection, the battery pack 3 is prepared for being shipped and combined with the vehicle body 2 and is transferred from the battery inspection site to the mounting site.

At the mounting site, the vehicle body 2 prepared and transferred is combined with the battery pack 3 prepared and transferred separately from the vehicle body 2. Prior to provision of the electric motorcycle 1 to a user (purchaser), the battery pack 3 is mounted on the vehicle body 2 at the mounting site. The mounting site is geographically different from the assembly and inspection sites for the vehicle body 2 and from the assembly and inspection sites for the battery pack 3. For example, the mounting site is a retail store where the electric motorcycle 1 as a finished product is sold.

As described above, the battery pack 3 is transferred from an inspection site to a storage site and transferred from the storage site to a mounting site after being subjected to a quality inspection and before being mounted on the vehicle body 2. At the storage site or during the transfer, the battery pack 3 may be damaged by falling over or by dropping from a person's hands. Thus, at the mounting site and after mounting of the battery pack 3 on the vehicle body 2, a competent person such as a retail dealer checks the diagnosis result obtained by the diagnosis section 51b and displayed by the display device 24. As previously described, the diagnosis result is obtained based on a history of motion information detected by the acceleration sensor 33 and angular velocity sensor 34 before the battery pack 3 is mounted on the vehicle body 2. It is determined from this diagnosis result whether the battery unit 31 may have been damaged before mounting of the battery pack 3 on the vehicle body 2, i.e., during transfer and storage of the battery pack 3.

If it is determined that the battery unit 31 may have been damaged, for example, another battery pack 3 is mounted on the vehicle body 2, then the diagnosis result for the other battery pack 3 is checked, and subsequently the motorcycle 1 is provided to the user.

Referring back to FIGS. 1 to 4, in the electric motorcycle 1 provided to the user, the vehicle controller 26 estimates the posture of the electric motorcycle 1 during travel based on motion information detected by the acceleration sensor 33 and angular velocity sensor 34 of the battery pack 3.

In the present embodiment, the three axes (X, Y, and Z axes) of the sensor coordinate system of each of the acceleration sensor 33 and angular velocity sensor 34 are respectively parallel to the forward/rearward, leftward/rightward, and upward/downward directions of the electric motorcycle 1. Thus, the values detected by the acceleration sensor 33 for the directions of the X, Y, and Z axes can be used per se as the accelerations of the electric motorcycle 1 in the forward/rearward, leftward/rightward, and upward/downward directions. The values detected by the angular velocity sensor 34 for the directions of the X, Y, and Z axes can be used per se as angular velocities of the electric motorcycle 1 about predetermined axes which extend in the forward/rearward, leftward/rightward, and upward/downward directions. The vehicle controller 26 can use measurement values obtained by the acceleration sensor 33 and angular velocity sensor 34 in a manner similar to that in which measurement values obtained by an acceleration sensor and angular velocity sensor mounted on a vehicle body of a conventional straddle motorcycle are used, and the vehicle controller 26 can estimate the posture of the electric motorcycle 1 during travel using a conventionally known method.

In the present embodiment, as described above, the inclusion of the acceleration sensor 33 and angular velocity sensor 34 in the battery pack 3 enables detection of the motion of the battery pack 3 before mounting of the battery pack 3 on the vehicle body 2 of the electric motorcycle 1 (e.g., during storage of the battery pack 3, during transfer of the battery pack 3, and during a period in which the battery pack 3 is detached from the vehicle body 2). This allows the battery monitoring unit 36 to use the motion information history recorded in the memory device 52 to diagnose what state the battery unit 31 has been in before mounting on the vehicle body 2. For example, the battery monitoring unit can diagnose whether the battery unit 31 may have been damaged by an external physical load before mounting on the vehicle body 2.

In the present embodiment, therefore, the state of the battery unit 31 can be diagnosed before the electric motorcycle 1 with the battery pack 3 mounted thereon is driven.

Additionally, in the present embodiment, the motion information detected by the acceleration sensor 33 and angular velocity sensor 34 is used for estimation of the posture of the vehicle body 2 after mounting of the battery pack 3 on the vehicle body 2. This eliminates the need for disposing another acceleration sensor 33 and another velocity sensor 34 on the vehicle body 2 in order to estimate the posture of the vehicle body 2 during travel. Thus, the flexibility in space layout of the vehicle body 2 can be increased, and at the same time cost reduction of the electric motorcycle 1 can be achieved.

Additionally, in the present embodiment, the processing device 51 of the battery monitoring unit 36 diagnoses what state the battery unit 31 of the battery pack 3 has been in before mounting of the battery pack 3 on the vehicle body 2. This eliminates the need for providing an additional device for analysis of the history of the motion information.

Additionally, in the present embodiment, the diagnosis result of the state of the battery unit 31 is displayed by the display device 24 of the electric motorcycle 1. This makes it easy to check the diagnosis result of the battery unit 31.

Additionally, in the present embodiment, the acceleration sensor 33 and angular velocity sensor 34 are located in a central region of the vehicle body 2 in the leftward/rightward direction when the battery pack 3 is housed in the housing space 2a of the vehicle body 2. This allows the vehicle controller 26 to estimate the posture of the vehicle body 2 with improved accuracy.

Additionally, in the present embodiment, the three axes of each sensor coordinate system are respectively parallel to the forward/rearward, leftward/rightward, and upward/downward directions of the vehicle body 2 when the battery pack 3 is housed in the housing space 2a. Thus, the detection values obtained by the acceleration sensor 33 and angular velocity sensor 34 with respect to the sensor coordinate systems can be used as values obtained with respect to the coordinate system of the electric motorcycle 1. This enables the vehicle controller 26 to easily use the detection values of the acceleration sensor 33 and angular velocity sensor 34 for estimation of the posture of the vehicle body 2.

Modified Example

Figure 6:
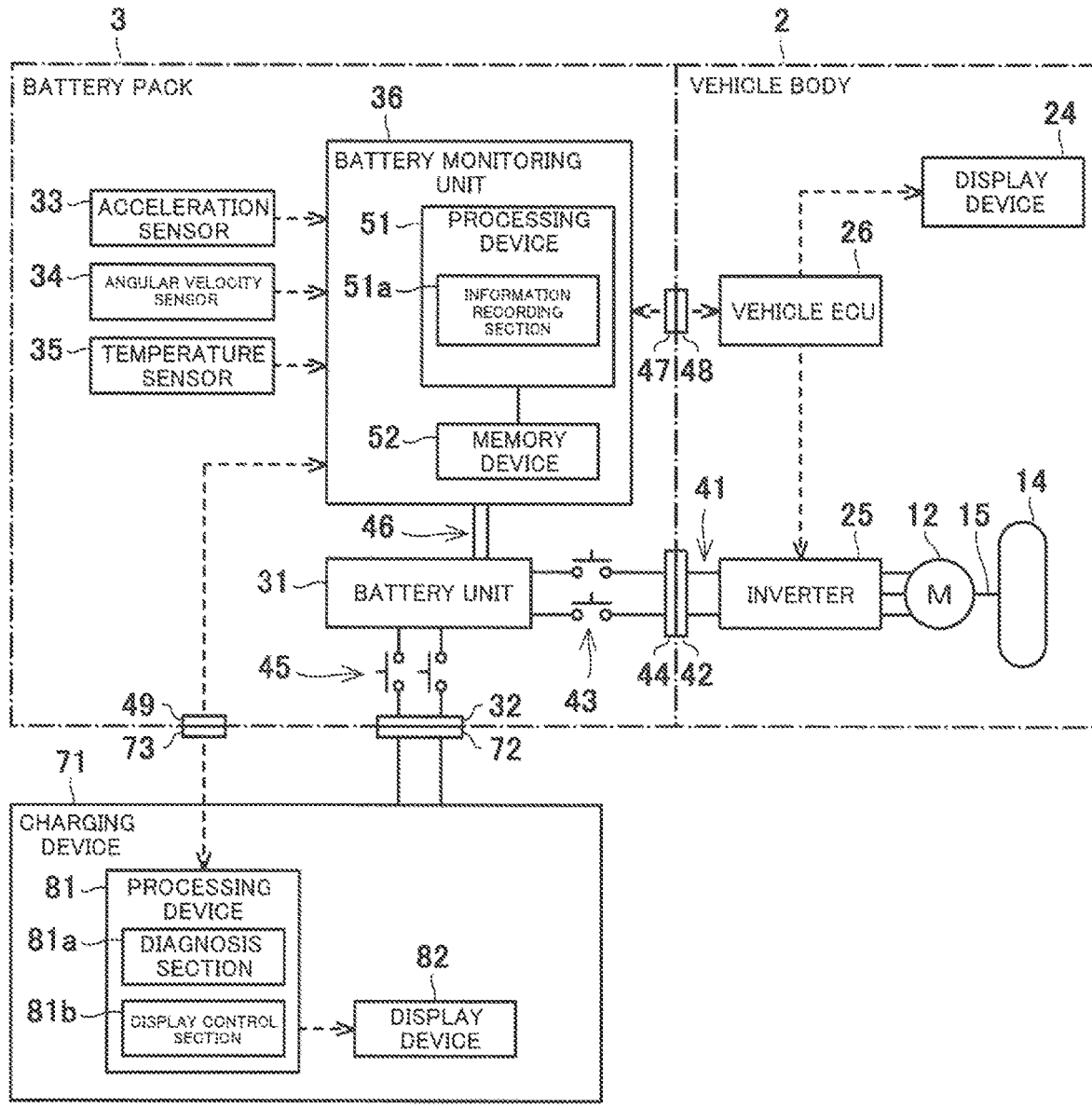
FIG. 6 is a block diagram showing the electrical configuration of an electric motorcycle according to a modified example.

FIG. 6 is a block diagram showing the electrical configuration of an electric motorcycle according to a modified example of the above embodiment. The electric motorcycle according to this modified example differs from the motorcycle of the above embodiment in that the state of the battery unit 31 is diagnosed by a charging device 71 which is an external power supply for supplying electricity to the battery unit 31, rater than by the battery monitoring unit 36. The electric motorcycle according to the modified example differs from the motorcycle of the above embodiment also in that the diagnosis result is displayed by a display device 82 included in the charging device 71.

Like the charger 61 of the above embodiment, the charging device 71 has a connector 72 connected to the charging connector 32 of the battery pack 3 and thus supplies and charges the battery unit 31 with electricity. The charging device 71 includes a processing device 81 and the display device 82.

The processing device 81 is communicatively connectable to the battery monitoring unit 36. Specifically, the battery monitoring unit 36 is communicatively connected to a battery-side communication connector 49 (corresponding to the "interface" of the present invention), and the processing device 81 is communicatively connected to a charging device-side communication connector 73. The two connectors 49 and 73 are mechanically and electrically connected to enable two-way transmission of information between the battery monitoring unit 36 and the processing device 81. Motion information stored in the memory device 52 is sent from the battery monitoring unit 36 to the processing device 81.

The processing device 81 includes a memory storing various programs and a CPU that performs processing operations by executing the programs stored in the memory. The processing device 81 functions as a diagnosis section 81a and a display control section 81b by executing predetermined programs stored in the memory. The diagnosis section 81a diagnoses the state of the battery unit 31 based on motion information received from the battery monitoring unit 36. The display control section 81b controls the display device 82 to cause the display device 82 to display a diagnosis result obtained by the diagnosis section 81a.

This modified example provides the same effect as the above embodiment. Additionally, in the modified example, the diagnosis result is displayed by the display device 82 included in the charging device 71. This allows the diagnosis result to be checked during charging. Further, the state of the battery unit 31 can be checked before mounting of the battery pack 3 on the vehicle body 2.

In the modified example described here, the charging device 71 performs both diagnosis of the battery unit 31 and display of the diagnosis result. Alternatively, the diagnosis of the battery unit 31 may be performed by the battery monitoring unit 36, and only the display of the diagnosis result may be performed by the charging device 71. The diagnosis of the battery unit 31 and the display of the diagnosis result may be performed by an external device other than the charging device 71 (an example of the external device is a personal computer). The diagnosis of the battery unit 31 may be performed by the vehicle controller 26.

The battery monitoring unit 36 and the vehicle controller 26 may each include a diagnosis section. For example, the diagnosis section of the battery pack 3 may evaluate whether the battery pack 3 has been dropped before mounting on the vehicle body 2 depending on whether impact forces calculated based on the motion information history include an impact force larger than a predetermined threshold, and the diagnosis section of the vehicle controller 26 may determine whether the use of the battery pack 3 is acceptable based on the evaluation result obtained from the diagnosis section of the battery pack 3 as to whether the battery pack 3 has been dropped. In this case, for example, the diagnosis section of the vehicle controller 26 may examine the diagnosis result (as to whether the battery pack has been dropped) obtained from the diagnosis section of the battery pack and another inspection result (e.g., a dark current measurement result) in a comprehensive way in order to determine whether the use of the battery pack 3 is acceptable.

OTHER EMBODIMENTS

Although the foregoing has described an embodiment, modifications, omissions, and additions may be made to the above-described configuration within the scope of the present invention.

For example, while in the above embodiment the battery pack 3 includes both the acceleration sensor 33 and the angular velocity sensor 34, the battery pack of the present invention may be configured to include either the acceleration sensor 33 or the angular velocity sensor 34 as the detector of the present invention. For example, when the battery pack 3 includes only the angular velocity sensor 34 as the detector of the present invention, the vehicle body 2 may include the acceleration sensor 33. The detector is not limited to the acceleration sensor or angular velocity sensor, and may be a temperature sensor or a battery voltage sensor that enables evaluation of a history of what state the battery has been in while handled separately from the vehicle body.

While in the above embodiment the battery pack 3 includes both the battery-side electricity supply connector 44 connectable to the vehicle body-side electricity supply connector 42 and the charging connector 32 connectable to the connector 62 of the charger 61, the present invention is not limited to this configuration. That is, the battery pack of the present invention may include one connector connected for electricity supply from the battery unit to the inverter and further connected for charging of the battery unit with electricity supplied from the charger. In this case, the connector of the charger is connected to the connector for both electricity supply and charging before mounting of the battery pack on the vehicle body, and the vehicle body-side electricity supply connector for connection to the inverter is connected to the connector for both electricity supply and charging when the battery pack is mounted on the vehicle body.

In the modified example described above, the diagnosis result of the battery unit 31 can be checked before mounting of the battery pack 3 on the vehicle body. The diagnosis result check prior to mounting of the battery pack 3 on the vehicle body may be enabled by a configuration different from that of the modified example. For example, the battery pack 3 may include an output device that outputs the diagnosis result. For example, the battery pack 3 may include a display device that displays the diagnosis result. For example, the battery pack 3 may include a light-emitting device that switches between different illumination modes depending on the diagnosis result.

The types of the electric motor 12 and the battery of the battery unit 31 are not limited to those in the embodiment described above. The electric motor 12 may be a DC motor instead of being an AC motor. The battery need not be a lithium-ion battery and may be, for example, a nickel-hydrogen battery.

While in the above embodiment an electric motorcycle has been described as an example of the movable machine of the present invention, the movable machine of the present invention is not limited to electric motorcycles. For example, the present invention is applicable to other types of electric straddle vehicles such as electric three-wheeled vehicles and electric all terrain vehicles (ATVs), as well as to electric motorcycles. Generally speaking, the movable machine of the present invention may be any movable machine including the removably mounted battery pack of the present invention and an electric motor for propulsion that uses the battery unit of the battery pack as a power source or an auxiliary power source. The movable machine of the present invention may be, for example, a utility vehicle, an unmanned vehicle movable without a human driver on board, or a hybrid electric vehicle (HEV) that includes an engine serving as a power source and an electricity generation source. In the case of a vehicle such as an electric motorcycle which is capable of traveling in an inclined state, it is especially important to estimate the posture of the vehicle during travel, namely to estimate how much the vehicle is inclined during travel. Thus, it is particularly preferable that the movable machine of the present invention, in which the posture of the movable machine during travel is estimated based on motion information detected by the detector, be configured as a vehicle capable of traveling in an inclined state.

In the above embodiment, with the battery pack 3 mounted on the vehicle body 2, the three axes (X, Y, and Z axes) of the sensor coordinate system of each of the acceleration sensor 33 and angular velocity sensor 34 which serve as the detector are respectively parallel to the forward/rearward, leftward/rightward, and upward/downward directions of the electric motorcycle 1. However, the present invention is not limited to this configuration. For example, at least one of the three axes of the coordinate system of the detector may be non-parallel to the corresponding one of the forward/rearward, leftward/rightward, and upward/downward directions of the electric motorcycle 1, or all of the three axes may be respectively non-parallel to the three directions of the electric motorcycle 1. In these cases, if the relationship between the coordinate system of the detector of the battery pack 3 mounted on the vehicle body 2 and the vehicle coordinate system (the forward/rearward, leftward/rightward, and upward/downward directions) of the electric motorcycle 1 can be known, the values detected by the detector can be used for estimation of the posture of the vehicle body 2 by performing a coordinate transformation that provides conversion of the detected values to values as determined with respect to the vehicle coordinate system.

Many modifications and other embodiments of the present invention will be apparent to those skilled in the art from the foregoing description. Accordingly, the foregoing description is to be construed as illustrative only, and is provided for the purpose of teaching those skilled in the art the best mode for carrying out the invention. The details of the structure and/or function may be varied substantially without departing from the scope of the invention.

What is claimed is:

1. A battery pack configured to be removably mounted on a vehicle body of a movable machine, the vehicle body including a vehicle controller, the battery pack comprising:
    a rechargeable battery unit;
    a detector secured to the battery unit to detect a motion of the battery unit;
    a battery monitoring unit including a memory device and a processing device configured to record a history of motion information detected by the detector in the memory device; and
    a communication connector configured to communicatively connect the battery monitoring unit to the vehicle controller and output the motion information recorded in the memory device to the vehicle controller.

2. The battery pack according to claim 1, further comprising a temperature sensor configured to detect a temperature of the battery unit, wherein
    the processing device diagnoses a state of the battery unit based on a history of temperature information detected by the temperature sensor.

3. A movable machine comprising:
    the battery pack according to claim 1; and
    an electric motor for propulsion of the movable machine, the electric motor being configured to use the battery unit of the battery pack as a power source or an auxiliary power source.

4. The movable machine according to claim 3, being a vehicle capable of traveling in an inclined state,
    the movable machine further comprising a computing device configured to estimate a posture of the movable machine during travel based on motion information detected by the detector after mounting of the battery pack on the movable machine.

5. The movable machine according to claim 4, wherein the computing device or the processing device diagnoses a state of the battery unit based on the history of motion information, the motion information being detected by the detector before mounting of the battery pack on the movable machine.

6. The movable machine according to claim 4, further comprising a display device configured to display a result of diagnosis made by the computing device or the processing device for a state of the battery unit.

7. The movable machine according to claim 4, further comprising a battery placement portion in which the battery pack is placed with the memory device electrically connected to the computing device via the communication connector, wherein
    the battery placement portion is configured so that the detector of the battery pack placed in the battery placement portion is located in a central region of the movable machine in a leftward/rightward direction.

8. The movable machine according to claim 4, further comprising a battery placement portion in which the battery pack is placed with the memory device electrically connected to the computing device via the communication connector, wherein
    the detector has a sensor coordinate system having three axes orthogonal to one another and detects the motion of the battery unit with respect to the sensor coordinate system, and
    the battery placement portion is configured so that the three axes of the sensor coordinate system of the detector of the battery pack placed in the battery placement portion are respectively parallel to a forward/rearward direction, a leftward/rightward direction, and an upward/downward direction of the movable machine.

9. The battery pack according to claim 1, wherein
    the detector has a sensor coordinate system having three axes orthogonal to one another and detects the motion of the battery unit with respect to the sensor coordinate system, and
    the processing device causes the memory device to record the history of motion information detected by the detector in directions of the three axes and calculates impact forces applied to the battery unit in the directions of the three axes based on the history of motion information detected in the directions of the three axes.

10. The battery pack according to claim 1, wherein the detector includes an acceleration sensor and an angular velocity sensor.

11. The battery pack according to claim 1, wherein the detector includes: a triaxial acceleration sensor that detects accelerations in directions of three axes orthogonal to one another; and a triaxial angular velocity sensor that detects angular velocities about the three axes orthogonal to one another.

12. The battery pack according to claim 1, further comprising an electrical supply connector independent of the communication connector, the electrical supply connector being electrically connected to the battery unit to supply electricity from an outside of the battery pack to the battery unit or supply electricity from the battery unit to the outside of the battery pack.

13. A battery pack configured to be removably mounted on a vehicle body of a movable machine, the vehicle body including a vehicle controller, the battery pack comprising:
- a rechargeable battery unit;
- a detector secured to the battery unit to detect a motion of the battery unit;
- a battery monitoring unit including a memory device and a processing device configured to record a history of motion information detected by the detector in the memory device;
- a communication connector configured to communicatively connect the battery monitoring unit to the vehicle controller and output the motion information recorded in the memory device to the vehicle controller; and
- an electrical supply connector independent of the communication connector, the electrical supply connector being electrically connected to the battery unit to supply electricity from an outside of the battery pack to the battery unit or supply electricity from the battery unit to the outside of the battery pack.

* * * * *